(12) United States Patent
Tunks et al.

(10) Patent No.: US 12,295,131 B2
(45) Date of Patent: May 6, 2025

(54) VACUUM STATIC SERVICE BAG FOR SERVERS

(71) Applicant: Dell Products L.P., Round Rock, TX (US)

(72) Inventors: Eric Michael Tunks, Austin, TX (US); Ayedin Nikazm, Austin, TX (US)

(73) Assignee: Dell Products L.P., Round Rock, TX (US)

(*) Notice: Subject to any disclaimer, the term of this patent is extended or adjusted under 35 U.S.C. 154(b) by 367 days.

(21) Appl. No.: 17/577,576

(22) Filed: Jan. 18, 2022

(65) Prior Publication Data

US 2023/0232602 A1 Jul. 20, 2023

(51) Int. Cl.
| | | |
|---|---|---|
| *B65D 81/18* | (2006.01) | |
| *B65B 31/04* | (2006.01) | |
| *B65D 33/04* | (2006.01) | |
| *B65D 81/20* | (2006.01) | |
| *B65D 81/26* | (2006.01) | |
| *H05F 1/00* | (2006.01) | |
| *H05K 9/00* | (2006.01) | |

(52) U.S. Cl.
CPC .......... *H05K 9/0043* (2013.01); *B65B 31/04* (2013.01); *B65D 33/04* (2013.01); *B65D 81/2038* (2013.01); *B65D 81/268* (2013.01); *H05F 1/00* (2013.01); *H05K 9/0067* (2013.01)

(58) Field of Classification Search
CPC .. B65D 33/04; B65D 81/2038; B65D 81/268; B65D 81/266; H05K 9/0043; H05K 9/0067; H05F 1/00

USPC .......................................................... 206/720
See application file for complete search history.

(56) References Cited

U.S. PATENT DOCUMENTS

| | | | | |
|---|---|---|---|---|
| 4,875,581 | A * | 10/1989 | Ray ................... | H01L 23/60 524/910 |
| 6,531,197 | B2 * | 3/2003 | Neteler ............... | B32B 15/085 428/458 |
| 7,967,166 | B2 * | 6/2011 | Pham ................. | B65D 77/062 383/44 |
| 2005/0037163 | A1 * | 2/2005 | Wu ..................... | B65B 9/042 428/34.2 |
| 2005/0145524 | A1 * | 7/2005 | Lee .................... | B65D 85/38 206/454 |
| 2005/0205455 | A1 * | 9/2005 | Harrison ............. | B65D 33/01 206/524.8 |
| 2011/0180429 | A1 * | 7/2011 | Josephson .......... | A61L 12/086 206/205 |
| 2015/0175313 | A1 * | 6/2015 | Amemiya ........... | B65D 33/01 383/100 |

* cited by examiner

*Primary Examiner* — Steven A. Reynolds
(74) *Attorney, Agent, or Firm* — Chamberlain, Hrdlicka, White, Williams & Aughtry; Aly Z. Dossa

(57) ABSTRACT

Embodiments of the present invention provide a method, anti-static bag, and kit for transporting an electronic component in the anti-static bag. Along with the electronic component, a desiccant and a temperature indicator are added to the anti-static bag. The anti-static bag is then vacuum sealed to reduce the air and moisture in the anti-static bag. The vacuum sealed bag, desiccant, and temperature indicator, insure that the formation of condensation on the electronic component will be minimized, which will potentially prolong the life of the electronic component.

7 Claims, 7 Drawing Sheets

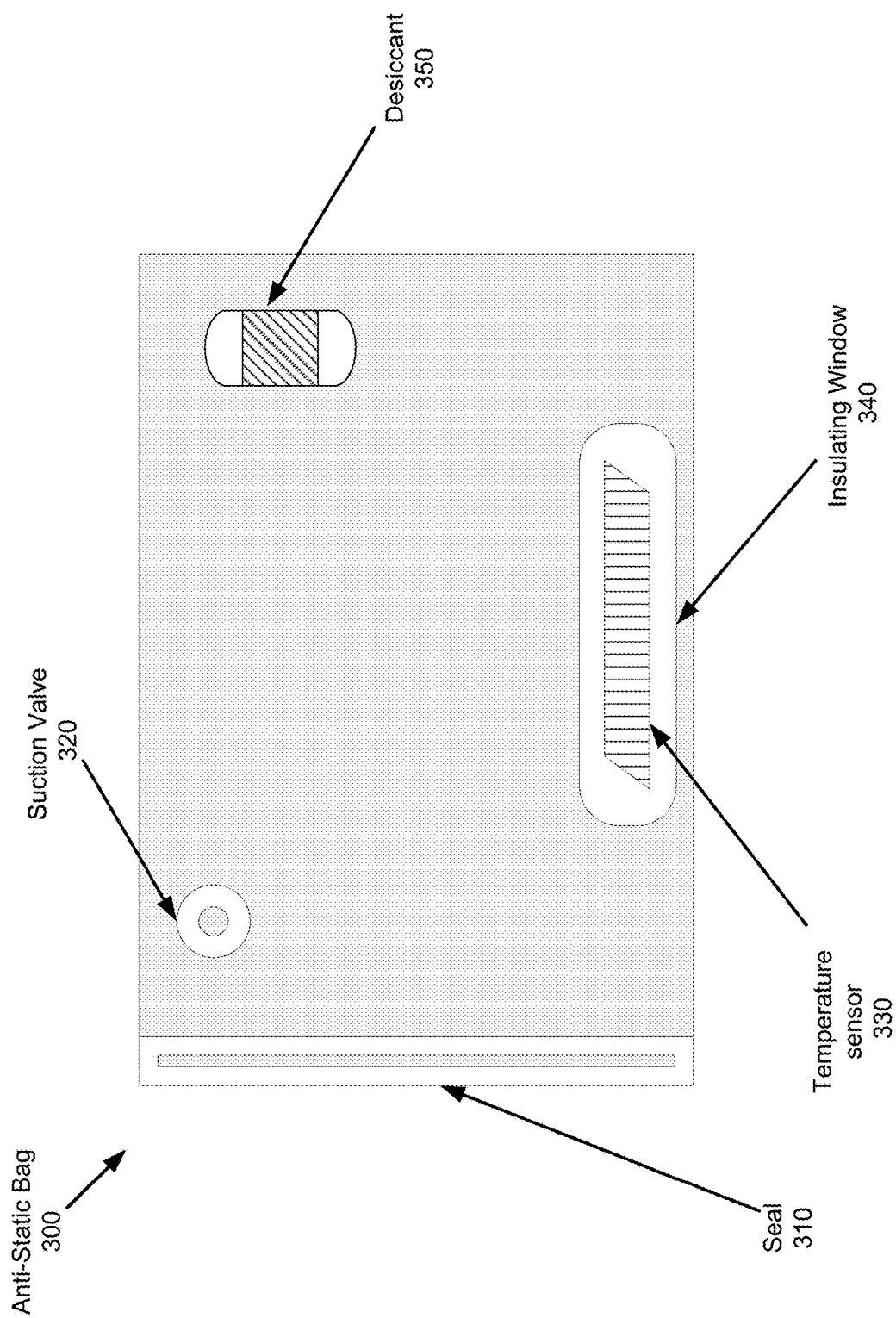
FIG. 3.1

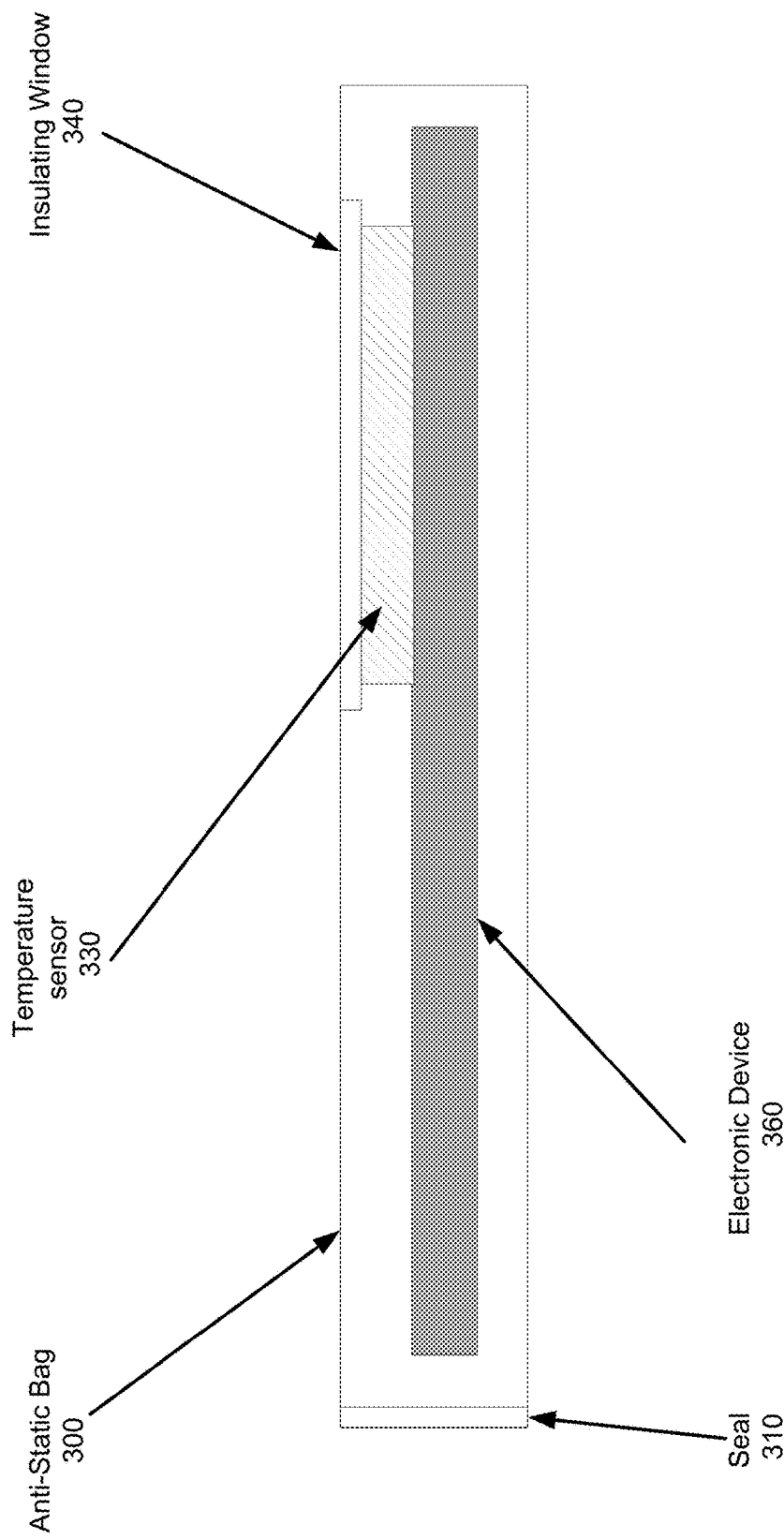
FIG. 3.2

VACUUM STATIC SERVICE BAG FOR SERVERS

BACKGROUND

As networking and communication technologies advance, there is an increased need for providing datacenters closer to the end users or on the "Edge". These datacenters are typically smaller than that of large "Cloud" based datacenters, but still have requirements that are similar to those of large Cloud based datacenters.

The information handling system mounted in the datacenters are generally designed for a 10° C. to 35° C. environment. However, Edge or Telco datacenters often have minimal or no heating or cooling capabilities. This can result in information handling systems and their components needing to operate below or above the range which they are designed for.

When components of the datacenter need to be removed and/or transported, they may initially be at a low temperature. This risk condensation forming on the components when they are brought into a warmer environment. The components then need to be dried before they can be used again or risk damaging the components and/or the components they are connected to.

SUMMARY

Embodiments of the present invention provide a method and kit for transporting an electronic component in an anti-static bag that is vacuum sealed. The method and kit minimize the formation of condensation on the electronic component, which will potentially prolong the life of the electronic component.

In accordance with the first aspect, the present invention provides a bag for transporting an electronic device. The bag includes an opening having an air tight seal, a suction valve, and an insulating window. The bag is made of an anti-static material.

In accordance with the second aspect, the present invention a method for transporting an electronic device. The method includes placing a desiccant in an anti-static bag. After the desiccant is placed in the anti-static bag an electronic device with a temperature sensor attached to it is placed in the anti-static bag. The anti-static bag is then sealed. With the use of a vacuum pump, the air inside of the anti-static bag is then removed.

In accordance with the third aspect, it provides an electronic device transport kit. The kit includes an anti-static bag, a vacuum pump, desiccant packets, temperature sensors, and written instructions for using the kit. The written instruction for using the kit include the steps of placing at least one of the desiccant packets in the anti-static bag. Placing a temperature sensor on the electronic device that is to be transported and then placing the electronic device in the anti-static bag. Sealing the anti-static bag and then use the vacuum pump to remove air from the anti-static bag after it has been sealed.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 3.1 shows a top view of an anti-static bag in accordance with one or more embodiments of the invention.

FIG. 3.2 shows a side view of an anti-static bag in accordance with one or more embodiments of the invention.

DETAILED DESCRIPTION

Figure 1:
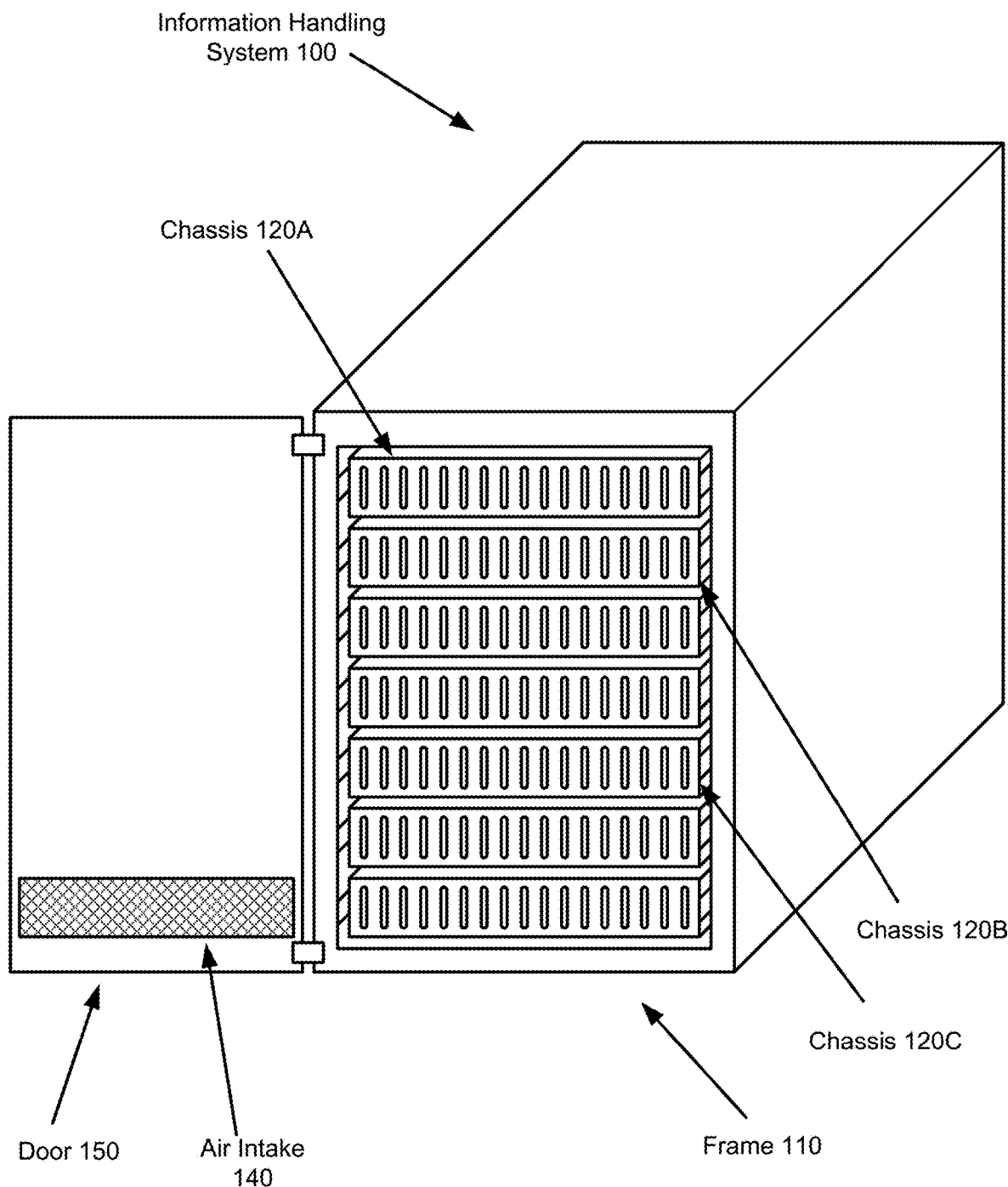
FIG. 1 shows a front view of a diagram of an information handling system in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regards to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for transporting an electronic device. The electronic device can be any device, such as but not limited to: a server blade or chassis, an information handling device, a personal computer, television, a smart phone, a tablet computer, hard-drives, add-on cards, or any other electronic device that is sensitive to either or both, moisture or static electricity.

In at least one embodiment the electronic device is part of an information handling system that may be a system that provides computer implemented services. These services may include, for example, database services, electronic communication services, data storage services, etc.

To provide these services, the information handling system may include one or more computing devices. The computing devices may include any number of computing components that facilitate providing of the services of the information handling system. The computing components may include, for example, processors, memory modules, circuit cards that interconnect these components, etc.

During the service life of the information handling system, components, such as individual chassis or circuit cards may need to be removed for service or replacement. Often this requires transporting them to another facility and exposure to the outside ambient environment. Without protection, these components may be exposed to external environmental/ambient air or gasses. The ambient air or gases may be at various temperatures, including outside of a safe operational temperature range. When the temperature is outside of the safe operational temperature range, many of the components can be damaged without making adjustments and/or providing heating or cooling as appropriate. They may also be exposed to dangerous gasses and/or static electricity. Without proper protection, over time, the transportation of the components may cause the components to fail prior to the computing devices meeting their expected service life.

Embodiments of the invention may provide methods, anti-static bags, and kits, to safely transport electronic devices such as computing components, in such a way to reduce risk of corrosion/moisture related failures as well as static related failures. By using a desiccant and vacuum sealing a bag that the electronic devices are transported in, the electronic device can be protected from moisture and other destructive materials in the ambient air. By using a temperature sensor, it can then be assumed that at the new location the electronic device is warmer than the local dew point, allowing for safe removal of the electronic device from the bag, without forming condensation.

FIG. 1 shows the front of an information handling system (100) in accordance with one or more embodiments of the invention. The information handling system (100) may include a frame (110) and any number of chassis (e.g., 120A, 120B, 120C).

The frame (110) may be a mechanical structure that enables multiple chassis (120A-120C) to be positioned with respect to one another. The mechanical structure of the frame (110) can include a door (150) that includes an air intake (140) for providing external ambient air to the chassis (120A) mounted within the frame (110).

The information handling system (100) can take many forms. For example, the frame (110) may be a rack mount enclosure that enables the chassis (120A) to be disposed within it. The frame (110) may also include a backup power supply (not shown) and other additional components needed to operate each individual chassis (120A-120C) mounted within.

The frame (110) may be implemented as other types of structures adapted to house, position, orient, and/or otherwise physically, mechanically, electrically, and/or thermally manage a chassis. By managing the chassis, the frame (110) may enable multiple chassis (120A) to be densely packed in a space without negatively impacting the operation of the information handling system (100).

A chassis (e.g., 120A) may be a mechanical structure for housing components of an information handling system. For example, a chassis (120A) may be implemented as a rack mountable enclosure for housing components of an information handling system. The chassis (120A) may take the form of a blade server or other rack mounted component. The chassis may be adapted to be disposed within the frame (110) and/or utilize services provided by the frame (110) and/or other devices. Any number of components may be disposed in each of the respective chassis (e.g., 120A, 120B, 120C).

Figure 2:
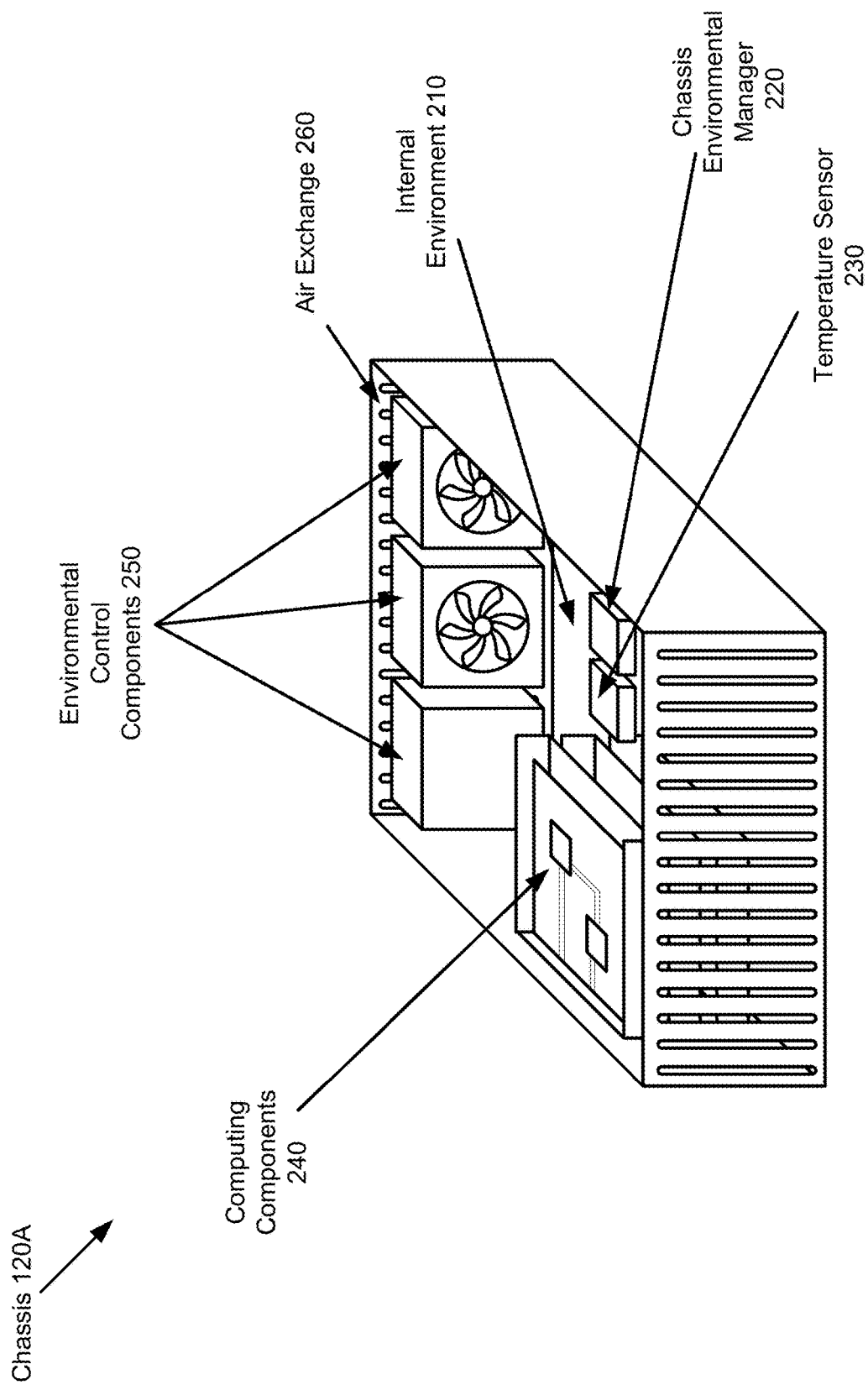
FIG. 2 shows a diagram of a chassis of an information handling system in accordance with one or more embodiments of the invention.

To further clarify the structure of a chassis (e.g., 120A), a diagram of an exemplary chassis is illustrated in FIG. 2.

FIG. 2 shows a diagram of a chassis (120A) in accordance with one or more embodiments of the invention. A chassis (120A) may be a portion of an information handling system (100) and/or house all, or a portion, of an information handling system (see FIG. 1). The chassis (120A) may take the form of a computing device that provides any number of services (e.g., computing implemented services). To provide services, the computing device may utilize computing resources provided by computing components (240). The computing components (240) may include, for example, processors, memory modules, storage devices, special purpose hardware, and/or other types of physical components that contribute to the operation of the computing device.

While the chassis (120A) of FIG. 2 has been illustrated as including a limited number of specific components, a chassis in accordance with one or more embodiments of the invention may include additional, fewer, and/or different components without departing from the invention. Additionally, while the chassis (120A) is illustrated as having a specific form factor (e.g., rack mount), a chassis in accordance with embodiments of the invention may have different form factors without departing from the invention including as a device that can operate by itself with or without a frame (FIG. 1, 110).

As discussed above, the chassis (120A) may house computing components (240). The computing components (240) may enable computing devices to provide services, as discussed above. The computing components (240) may include, for example, packaged integrated circuits (e.g., chips). The computing components (240) may enable any number and type of functionalities to be performed by a computing device.

In one or more embodiments disclosed herein, the computing components (240) include storage that is implemented using devices that provide data storage services (e.g., storing data and providing copies of previously stored data). The devices that provide data storage services may include hardware devices and/or logical devices. For example, storage may include any quantity and/or combination of memory devices (i.e., volatile storage), long term storage devices (i.e., persistent storage), other types of hardware devices that may provide short term and/or long term data storage services, and/or logical storage devices (e.g., virtual persistent storage/virtual volatile storage).

For example, the computing components (240) may include a memory device (e.g., a dual in line memory device) in which data is stored and from which copies of previously stored data are provided. In another example, the computing components (240) may include a persistent storage device (e.g., a solid state disk drive) in which data is stored and from which copies of previously stored data are provided. In another example, computing components (240) may include (i) a memory device (e.g., a dual in line memory device) in which data is stored and from which copies of previously stored data are provided and (ii) a persistent storage device that stores a copy of the data stored in the memory device (e.g., to provide a copy of the data in the event that power loss or other issues with the memory device that may impact its ability to maintain the copy of the data cause the memory device to lose the data).

Computing components may consume electrical power and generate heat as a byproduct of performing their functionality. Further, the computing components (240) may have some sensitivity to temperature. For example, the computing components (240) may only operate nominally (e.g., as designed) when the temperatures of the respective components (240) are maintained within a preferred temperature range. Consequently, all, or a portion, of the computing components (240) may require some level of cooling and/or heating to continue to operate nominally.

To maintain the temperatures of the computing components (240) (and/or other types of components) within a nominal range, external air such as ambient air may be taken in through an air exchange (260). The gases forming the external air may be passed by the computing components (240) to exchange heat with them. The heated gases may then be expelled out of the air exchange (260).

The gases forming the external air are moved by environmental control components (250). The environmental control components (250) may include gas movers such as fans. The fans may be able to modify the rate of gases being taken into and expelled from the chassis (120A) through the air exchangers (e.g., 260). The rate of intake and expelling of gases may cause an airflow to be generated within the internal environment (210). The airflow may be used to modify the rate of thermal exchange between the computing components (240) and the internal environment (210) (e.g., an environment proximate to the computing components (240)).

A chassis environmental manager (220) analyzes the internal temperature of the internal environment (210) and/or ambient temperatures outside of the chassis (120A) and/or information handling system (100) to maintain a desired temperature and environment in the internal environment (210). The chassis environmental manager (220) may control the environmental control components (250).

In one or more embodiments of the invention, the chassis environmental manager (220) is implemented using computing code stored on a persistent storage that when executed by a processor performs all, or a portion, of the functionality of the chassis environmental manager (220). The processor may be a hardware processor including circuitry such as, for example, a central processing unit or a microcontroller. The processor may be other types of hardware devices for processing digital information without departing from the invention.

The chassis environmental manager (220) and/or computing components (240) may include one or more data structures that include information regarding the environmental conditions within the internal environment (210) of the chassis (120A). For example, when temperature data is read from a temperature sensor (230), the read information may be stored in an environmental condition repository. Consequently, a historical record of the environmental conditions in the repository may be maintained. The historical record of the environmental conditions may include any type and quantity of information regarding the environmental conditions within the repository. For example, an environmental condition repository may include temperature sensor data from discrete temperature sensors and/or temperature sensors integrated into computing components (and/or other types of devices).

While the data structures stored in storage have been described as including a limited amount of specific information, any of the data structures stored in storage may include additional, less, and/or different information without departing from the embodiments disclosed herein. Further, the aforementioned data structures may be combined, subdivided into any number of data structures, may be stored in other locations (e.g., in a storage hosted by another device), and/or spanned across any number of devices without departing from the embodiments disclosed herein. Any of these data structures may be implemented using, for example, lists, tables, linked lists, databases, or any other type of data structures usable for storage of the aforementioned information.

The chassis (120A) may include any number and type of environmental control components without departing from the invention, including a temperature sensor (230) for determining the temperature in the internal environment (210). Any of the environmental control components may be implemented using physical devices operably connected to and/or controllable by the chassis environmental manager (220) and/or a system environmental managers that is part of the larger information handling system (alone or in combination). Any number of chassis environmental managers and system environmental managers may cooperatively operate to control the temperature and/or relative humidity levels of the internal environments of any number of chassis to control the rate of corrosion occurring within the chassis and/or manage the thermal load generated by the computing components (240) and/or other components.

While the chassis environmental manager (220), temperature sensor (230), environmental control components (250) and heating elements (280) of FIG. 2 have been described and illustrated as including a limited number of specific components for the sake of brevity, these components in accordance with embodiments of the invention may include additional, fewer, and/or different components than those illustrated in FIG. 2 without departing from the invention.

The chassis (120A) is illustrated as having a specific form factor (e.g., rack mount), however a chassis in accordance with embodiments of the invention may have different form factors without departing from the invention, including as a device that can operate by itself with or without a frame (110) including a personal computer, laptop, or other electronic devices.

As discussed above, the chassis (120A) may house various computing components (240). The computing components (240) may enable the chassis (120A) to provide services, as discussed above. The computing components may include, for example, packaged integrated circuits (e.g., chips). The computing components may enable any number and type of functionalities to be performed by a computing device.

In one or more embodiments disclosed herein, the computing components (240) in the chassis (120A) include storage that is implemented using devices that provide data storage services (e.g., storing data and providing copies of previously stored data). The devices that provide data storage services may include hardware devices and/or logical devices. For example, storage may include any quantity and/or combination of memory devices (i.e., volatile storage), long term storage devices (i.e., persistent storage), other types of hardware devices that may provide short term and/or long term data storage services, and/or logical storage devices (e.g., virtual persistent storage/virtual volatile storage).

For example, the computing components in the chassis (120A) may include a memory device (e.g., a dual in line memory device) in which data is stored and from which copies of previously stored data are provided. In another example, the computing components may include a persistent storage device (e.g., a solid state disk drive) in which data is stored and from which copies of previously stored data are provided. In another example, computing components may include (i) a memory device (e.g., a dual in line memory device) in which data is stored and from which copies of previously stored data are provided and (ii) a persistent storage device that stores a copy of the data stored in the memory device (e.g., to provide a copy of the data in the event that power loss or other issues with the memory device that may impact its ability to maintain the copy of the data cause the memory device to lose the data).

The components, including the computing components (240) disposed within the chassis (120A) may be subject to degradation due to corrosion and dust. For example the gases in the air may include components such as humidity that may chemically react with the computing components and/or other types of components disposed in the chassis (120A). The chemical reactions may damage the structure and/or change the electrical properties of the computing components. These changes may negatively impact the ability of the computing device to provide its functionality.

For example, the computing device may have a service life during which it is expected that the computing device will be likely to provide its functionality. However, changes in the structure and/or electrical properties of these components due to exposure to humidity or other components of the gases used for temperature regulation purposes may cause the components to prematurely fail ahead of the service life of the computing device. Further during maintenance or when upgraded, the components may need to be removed, exposing them to humidity or other components of the ambient air outside of the chassis (120A) and/or information handing system (100).

When removed from the chassis (120A), for example for servicing, the electronic components such as the computing components (240) of the chassis (120A) are exposed to gases such as air from the ambient environment. However, ambient air may be problematic and may not be benign. For example, the air may include gasses that are (i) outside of the preferred range of temperatures, (ii) include chemically reactive components, (iii) include humidity, (iv) include dust or other contaminants, and/or (v) otherwise interact with components disposed within the chassis in an undesirable manner. The reaction between the gases and the components themselves may negatively impact the components.

For example, if the gases include a chemically reactive component (e.g., chlorine species), the gases may react (i.e., chemically react) with portions of the components disposed within the chassis. These reactions may damage portions of the components resulting in a decreased service life of the components.

In another example, if the gases include humidity, the humidity may condense, resulting in water being disposed on the surface of the components. When water is disposed on the surface of the components (even at very small levels), the water may chemically react with the components forming corrosion. The aforementioned reactions with the condensed water may damage the components.

The potential reactions, discussed above, may cause numerous negative impacts. First, the reactions may impact the conductivity of various components. For example, when metals react with chemically reactive species, condensed water vapor, etc., the metals may form chemical compounds that are substantially less conductive than the pure metals. The reduced conductivities of the components may negatively impact the electrical functionality of the components (e.g., circuits) disposed within the chassis.

Second, the reactions may impact the physical size of various components. For example, when metals chemically react, the products formed by the reactions may occupy significantly larger volumes than the unreacted metals. The change in volumes of the reacted metals may negatively impact the electrical functionality of the components by, for example, forming open circuits by physically disconnecting various portions of the components.

The potential reactions may cause other negative impacts beyond those discussed herein.

To address the above and/or other potential issues such as exposure to static electricity, electronic devices such as the computing components (240) and/or the entire chassis (120A) are transported in anti-static bags. These bags typically reduce the contact that the electronic devices have with the ambient environment as well as reduce exposure to damaging static-electricity.

In many telecom and edge applications (as non-limiting examples), heating and cooling systems are either not present, or are not sufficient for extreme weather. Also in these applications, repairs and replacement of parts requires transporting the electronic devices between a well heated central facility and the telecom or edge application's facility. This may require the electronic device to sit in an unheated vehicle or container transported in the outside environment.

Embodiments of the invention may provide methods, anti-static bags, and kits that allow for safe transportation of electronic devices, in less than ideal environments. To prevent failure of the electronic devices, they are placed in anti-static bags, which have the ambient air removed, include a desiccant, and have a temperature sensor. This insures that the electronic devices are not exposed to excessive moisture and are maintained at a safe temperature at least when the electronic device is removed from the anti-static bag. Further the anti-static bag provides protection from static electricity and other possible damaging effects from the external environment.

To further clarify embodiments of the invention, a non-limiting example is provided in FIGS. 3.1 and 3.2 of an anti-static bag (300) which utilizes various means to protect an electronic device transported therein. FIG. 3.1 illustrates a top view of the anti-static bag, while FIG. 3.2 illustrates a side view of the anti-static bag with an electronic device (360) placed inside the anti-static bag (300). For the sake of brevity, only a limited number of components are illustrated in each of FIGS. 3.1 and 3.2. The anti-static bag (300) can also include additional components such as protective foam and/or bubble wrap, RFID tags, and other components as needed for a particular application.

The anti-static bag (300) of FIGS. 3.1 and 3.2 is made of a durable anti-static material. Anti-static bags are typically made of a polymer such as polyethylene terephthalate (PET) and include multiple layers including a conductive layer and a dielectric layer. The conductive layer can be made of a conductive metal such as aluminum, while the dielectric layer can include a static dissipative coating. Other combinations of materials can be used depending on the specific application.

The anti-static bag (300) includes a seal (310) placed on the opening of the bag. The seal may be a permanent seal, such as that provided by adhesive tape or other similar means. In at least some embodiments of the invention, the seal (310) can take the form of an interlocking groove and ridge that forms an air-tight seal when pressed together. In other embodiments the seal may be adhesive or magnetic and easily open, closed, and/or replaced as needed. By using a resealable seal (310), according to some embodiments, the anti-static bag (300) to be reused for transporting multiple electronic devices (360).

Since over time the layers of the anti-static bag can deteriorate, if the anti-static bag (300) is intended to be reused indications can be provided on the anti-static bag, such as a used by date. Alternatively the user of the anti-static bag can keep track of the use of the bag in a database or by other electronic or physical means. In other embodiments of the invention, the anti-static bag (300) could include a layer that changes color or opaqueness over time, indicating the amount of deterioration of the bag.

The anti-static bag (300) is designed to hold an electronic device (360) as shown in FIG. 3.2. The electronic device (360) in at least one embodiment is a server, blade, or chassis (120A) that has been removed from a rack of an information handling system (100). This requires the anti-static bag to be of significant enough size and strength to hold a chassis (120A). Alternative the electronic device (360) can be any type of electronic device needing safe transportation and the anti-static bag can be made an appropriate size for the specific device being transported.

In at least some embodiments, the anti-static bag (300) includes a suction valve (320). The suction valve can self-seal or can include a cover which is screwed onto the suction valve (320) in order to seal it. In at least one embodiment, when the valve is used a vacuum pump is attached to the valve by screwing on a vacuum pump. Other types of suction valves specific to a specific vacuum pump or other air evacuating means and/or valves can be used.

The anti-static bag (300), in at least some embodiments, also includes an insulating window (340). This window is designed to be more transparent then the material making up the rest of the bag. The insulating window (340) allows a user such as a technician to be able to view a temperature sensor (330), without having to open the seal (310) of the anti-static bag (300). The insulating window (340) should be made of insulating material that protects the electronic device from the ambient environment and static-electricity.

The window can include a temperature sensor (330) attached to it, or the temperature sensor (330) can be attached to the electronic device (360). As shown in FIG. 3.2 the temperature sensor (330) is placed under the insulating window (340), so that it is viewable through the insulating window. In at least one embodiment the temperature sensor (330) takes the form of a temperature strip that is adhesively attached to the electronic device (360) before inserting it in the anti-static bag (300). Other forms of temperature sensors (330) can be used, including temperature sensors that use radio frequency (RF) to report the temperature and they may not specifically require the use of an insulating window (340).

The anti-static bag (300) can also include a desiccant (350). In at least some embodiments the desiccant can take the form of a desiccant that is housed inside of a satchel, packet, capsule, or other container and placed within the bag. Alternatively the desiccant can be built into the anti-static bag (300). The desiccant (350) is a hygroscopic substance that induces or maintains a state of dryness in its vicinity. In at least one embodiment the desiccant takes the form of silica gel, however, other types of desiccants including activated charcoal, calcium sulfate, calcium chloride, zeolites, and other known substrates that can maintain a state of dryness in their vicinity can be used. Other means for removing moisture and humidity from the anti-static bag could be used and the invention is not limited to the use of a desiccant.

Figure 4:
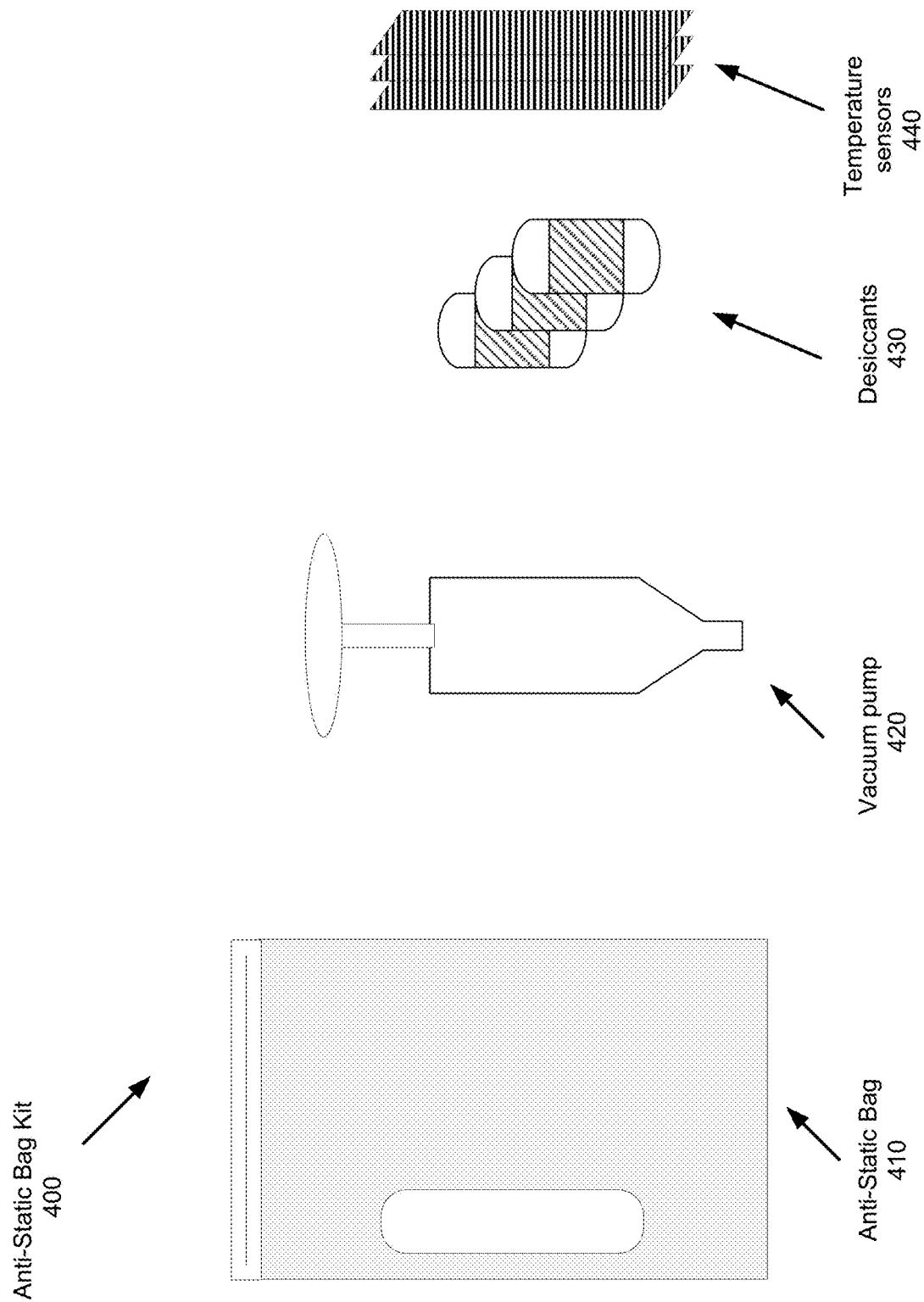
FIG. 4 shows an anti-static bag kit in accordance with one or more embodiments of the invention.

The anti-static bag (300), desiccant (350) and temperature sensor (330) can be part of a kit that provides the components to safely transport an electronic device (360). FIG. 4, provides an illustration of a non-limiting example, of an anti-static kit (400) that can be provided to a user, which uses the anti-static bag (300) of FIGS. 3.1 and 3.2 according to the embodiments of the invention.

The anti-static kit (400) of FIG. 4, includes an anti-static bag (410). This bag may be the same or similar to the anti-static bag (300) of FIGS. 3.1 and 3.2. The anti-static bag (410) is, in at least some embodiments, intended to be reused multiple times. Each time the anti-static bag is used, a new temperature sensor (440) which in some embodiments is in the form of a temperature strip, and desiccants (430) can be added to the bag, while the old temperature sensor (440) and desiccants (430) are discarded. Alternatively the anti-static bag can be a single use bag, and a plurality of anti-static bags would be provided in the kit along with more or less desiccants (430) and temperature sensors (440) as appropriate.

In general the desiccants can comprise of packets or satchels containing a predetermined quantity of a desiccant such as silica gel. As discussed with regards to FIGS. 3.1 and 3.2, desiccant (430) can take a variety of other forms. By providing a plurality of desiccants, a user can use one or more packets as needed for the particular application and the particular environment that the electronic device (360) is initially housed in. When used, the desiccant absorbs moisture/humidity from the air and environment found in the anti-static bag (410) when the electronic device is inserted in the anti-static bag (410).

Since the anti-static kit (400) is intended to be reused, in at least some embodiments, having a plurality of desiccants allows for the reuse of the anti-static bag, while utilizing unused packets that still have the capability to remove moisture. In other embodiments, reusable desiccant can also be used, however, this would require removing the absorbed moisture from the desiccant prior to each use. In still further embodiments, other means than that of a desiccant packet can be provided in the anti-static bag kit (400), to remove moisture from the anti-static bag (410) and the invention is not limited to desiccant packets.

The anti-static kit (400) additionally includes a plurality of temperature sensors (440). In at least some embodiments, the temperature sensors (440) comprise of an indicator which changes color to indicate the temperature of an item it is in contact with or to indicate if a temperature of the item is above or below a predetermined threshold. In other embodiments the temperature sensors (440) can take the form of a temperature strip that can include numbers that visually indicate the temperature of the electronic device. In still other embodiments the temperature sensors can be electronic temperature sensors that communicate the temperature to a user either through visual means or electronic means.

The temperature sensors (440) in some embodiments includes adhesive such as glue or adhesive tape for attaching the temperature strip to the electronic device and/or a window of the anti-static bag. When using the anti-static kit (400) a user takes a temperature sensor (440), attaches the temperature sensor (440) with its adhesive to the electronic device in such a location, that when the electronic device is placed in the anti-static bag (410) the visual indicator of the temperature sensor (440) is visible through a window of the anti-static bag (410).

After the anti-static bag is sealed, a vacuum pump (420) can be used to remove air from the anti-static bag (410). The vacuum pump (420) can take many forms. It can be a hand pump as shown, which will allow it to be used where limited electricity is provided. The vacuum pump (420) in other embodiment may be an electrical vacuum pump.

When used, the vacuum pump (420) is attached to a suction valve (320) of the anti-static bag (410) and air is drawn out of the bag. By drawing the air out of the bag, both condensation/humidity as well as other corrosive gasses can be removed from the bag and replaced with vacuum. Upon completion of drawing out the air of the anti-static bag, the valve (320) is then sealed Further the kit can include written instructions (not shown) that can instruct a user in how to use the anti-static kit (400) as will be described in more detail with regards to the method of FIGS. 5 and 6. The anti-static kit (400) can include more or less components then that shown in FIG. 4, and the anti-static kit (400) is only provided as an example of a possible anti-static kit (400) using the anti-static bag (410) and methods of the invention.

While the electronic device such as the information handling system (100) and chassis (120A) of FIGS. 1 and 2, as well as the anti-static bag (300) of FIGS. 3.1 and 3.2 and kit of FIG. 4 have been illustrated as including specific numbers and types of components, an electronic device, anti-static bag (300), and anti-static kit (400) in accordance with embodiments of the invention may include different, fewer, and/or additional components without departing from the invention.

Figure 5:
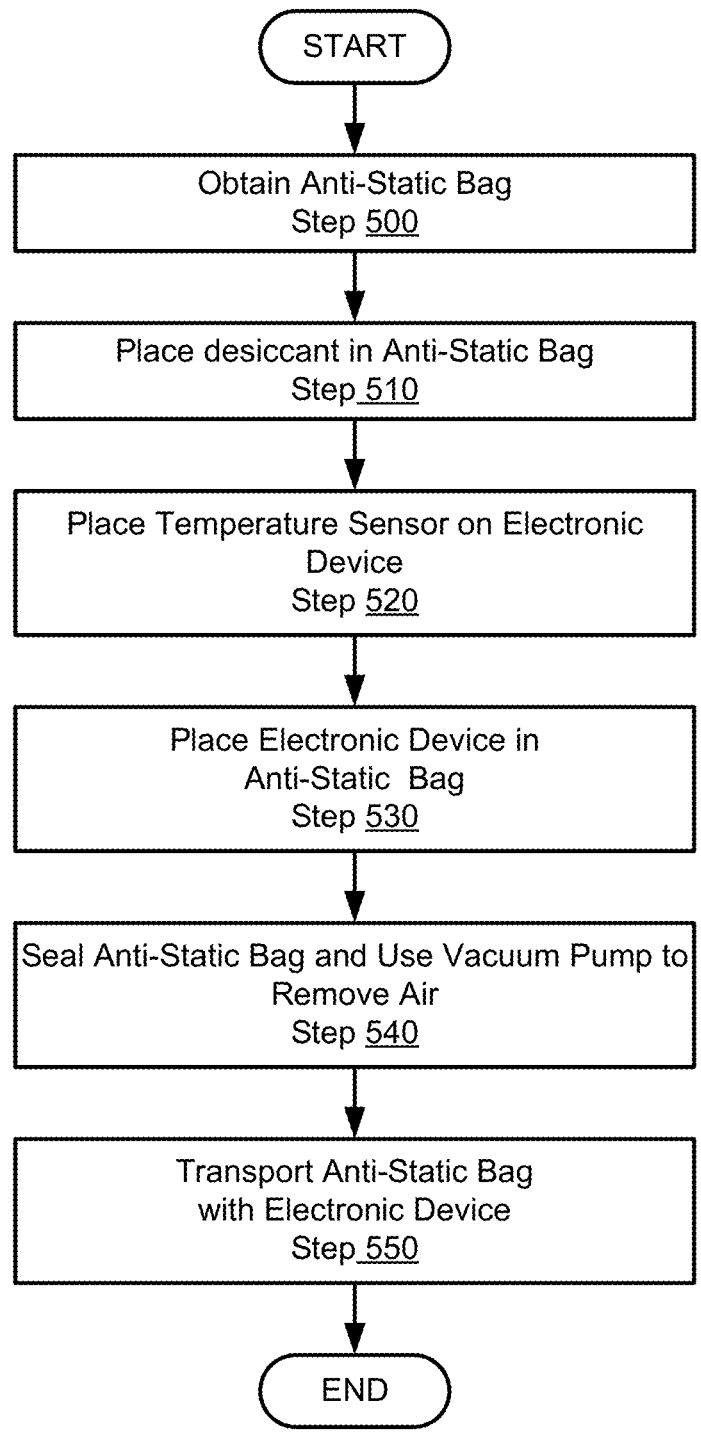
FIG. 5 shows a flowchart of a method for using the anti-static bag to transport an electronic Device in accordance with one or more embodiments of the invention.
Figure 6:
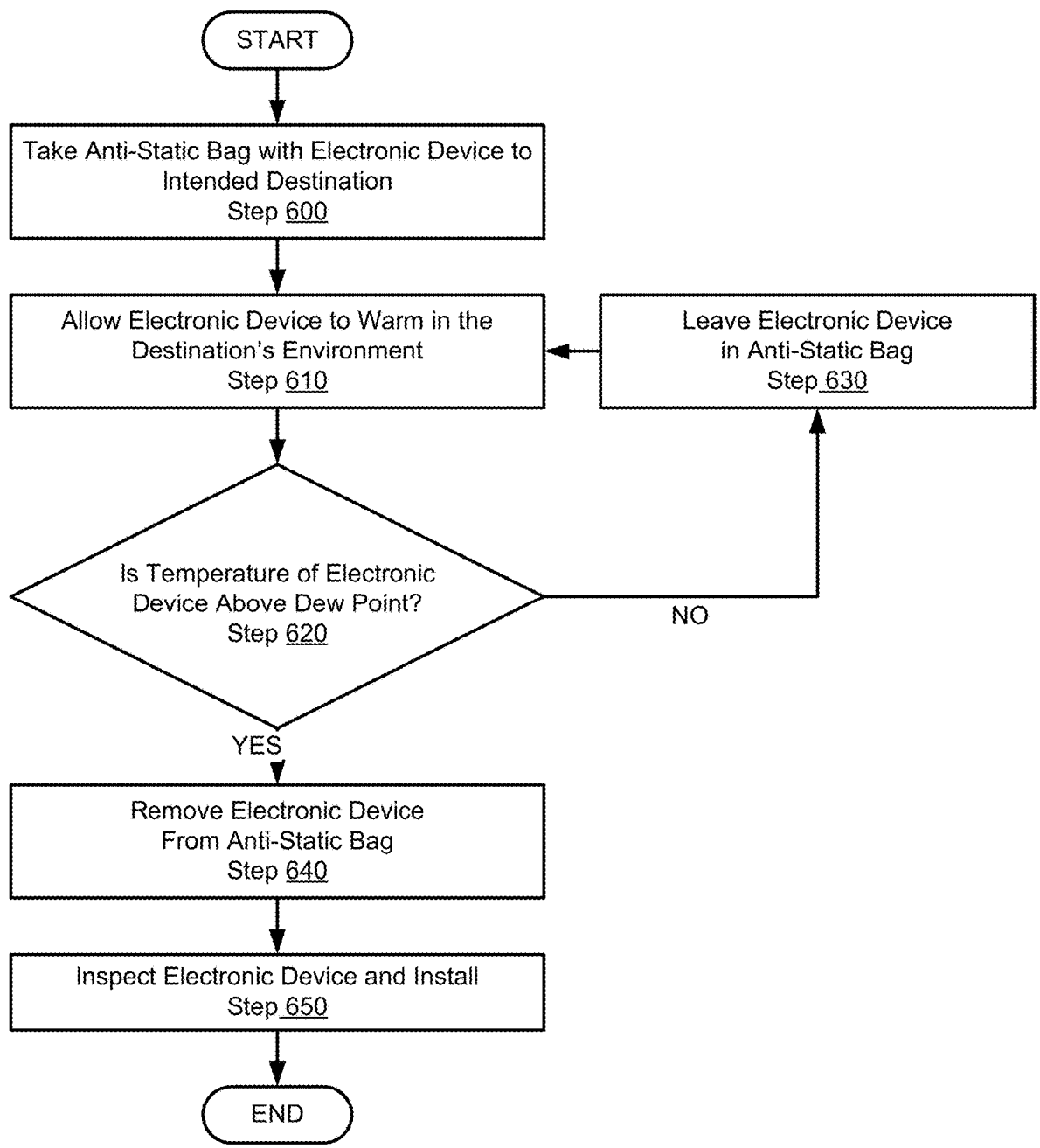
FIG. 6 shows a flowchart of a method for installing an electronic device transported in the anti-static bag in accordance with one or more embodiments of the invention.

FIGS. 5 and 6 show a flowchart of methods in accordance with one or more embodiments of the invention.

The method depicted in FIG. 5 may be part of the written instructions of an anti-static kit (400) of FIG. 4. Alternatively the method can be used without a kit by using the antistatic bag (300) of FIGS. 3.1 and 3.2 or other anti-static kits available to a user.

While FIG. 5 is illustrated as a series of steps, any of the steps may be omitted, performed in a different order, additional steps may be included, and/or any or all of the steps may be performed in a parallel and/or partially overlapping manner without departing from the invention.

In step 500, a user obtains an anti-static bag. As discussed above this anti-static bag can be the anti-static bag (300 or 410) as described with regards to FIGS. 3.1, 3.2, and 4. Alternatively the anti-static bag can be any known anti-static bag that provides sufficient protection from the environment that the electronic device is to be transported through, to prevent the electronic device from being damaged by that environment.

In step 510, a user places desiccant in the anti-static bag of step 500. The desiccant can take the form of packets or satchels that the user simply drops into the bag. Other forms of desiccant can be used as long as the desiccant can be safely housed with the electronic device in the anti-static bag and will remove enough moisture from the environment of the anti-static bag to insure the electronic device is not exposed to excessive or damaging amounts of moisture or humidity. Alternatively the anti-static bag can be manufactured to have a built in capability to provide moisture/humidity removing capabilities, such as having a hygroscopic layer. Other means of removing moisture and/or humidity from the anti-static bag can be used.

In step 520, a temperature sensor is placed in the anti-static bag or alternatively on the electronic device. This may comprise of using adhesive to adhere the temperature sensor to the bag or component. When using the anti-static bag (300) of FIGS. 3.1 and 3.2, the temperature sensor should be attached such that its readings are visible through the insulated window (340). If the temperature sensor uses other means then visual indicators to indicate the temperature in the anti-static bag, it can be placed in other locations in the anti-static bag as appropriate.

In steps 530 and 540, the electronic device is then placed in the anti-static bag and sealed. The bag can then have the ambient air and/or gasses removed by attaching a vacuum pump to a suction valve. The vacuum pump is then used as appropriate to remove a predetermined amount or the majority of the air in the in the anti-static bag. Once a sufficient amount of air is removed, the pump is detached from the suction valve.

In step 550 the anti-static bag containing the electronic device, temperature sensor, and desiccant is transported. The anti-static bag can be used to transport and electronic device safely to any location where it needs to be moved to. This can be from the information handling system (100) to a central location where repairs can be made to the electronic device. Alternatively this can be from a manufacture or a repair facility to the information handling system (100) or other location for installation and use.

The method of FIG. 5 may end following step 550.

The method depicted in FIG. 6 describes a method for removing the electronic device from the anti-static bag, when it reaches its intended destination. The electronic device may have been previously placed in the anti-static bag (300 or 410) using the method of FIG. 5 or by an alternative method that includes a means for determining the temperature of the electronic device while sealed inside the anti-static bag. The method is performed by an end user and in some embodiments can be included in instructions provided with the anti-static bag kit (400) described with regards to FIG. 4.

While FIG. 6 is illustrated as a series of steps, any of the steps may be omitted, performed in a different order, additional steps may be included, and/or any or all of the steps may be performed in a parallel and/or partially overlapping manner without departing from the invention.

In step 600, an electronic device and an anti-static bag holding it are brought to an intended destination. As discussed with regards to FIG. 5, this may be a repair facility or other centralized location where repairs or other activities with the electronic device are to be performed. Alternatively this can be the location/facility where the electronic device is intended to be used such as the information handling system (100).

Upon reaching the intended destination in step 600, the electronic device inside of the anti-static bag is allowed to warm, while remaining in the anti-static bag. For example if the electronic device was transported from a cold telco information handling system (100) to a central repair facility, the electronic device would need to be warmed from the ambient temperature of the telco information handling system (100) and the ambient environment during the trip, to that of the presumably significantly warmer environment of a central repair facility.

As a non-limiting example, suppose the information handling system (100) is at −10° C. and the intended destination is at 30° C., the electronic device would initially be closer to the −10° C. of the information handling system (100) than that of the intended destination at 30° C. Accordingly, the electronic device would need to warm at the intended destination by absorbing ambient heat present in the environment of the intended destination, in order to avoid the formation of condensation when removed from the anti-static bag.

At step 620, a user performing the method determines if the electronic device has warmed above the dew point of the intended destination. The dew point is the temperature below which at a particular pressure and humidity, water droplets begin to condense on surfaces. By determining that the temperature of the electronic device is above the dew point, less condensation will form when the electronic device is removed from the anti-static bag.

The temperature can be determined by using a temperature sensor included in the anti-static bag. In other embodiments a user can used an external temperature detecting device, such as an infrared camera/thermometer to determine the temperature of the electronic device within the sealed anti-static bag. In yet other embodiments the electronic device can be left in the bag for such a time that for a known electronic device at a known starting temperature, it will at least reach a temperature that is greater than the dew point of the destination's ambient air.

If the temperature is below the dew point the method proceeds to step 630, where the electronic device is left sealed in the anti-static bag and steps 610 and 620 are repeated until the temperature of the electronic device is above the dew point in step 620. When the temperature is above the dew point in step 620 the method proceeds to step 640.

In step 640, the electronic device is removed from the anti-static bag. It is then inspected in step 650 for any damage or condensation. It can then be used in an information handling system (100) or be repaired or stored as appropriate. The method of FIG. 6 may end following step 650.

Embodiments of the invention may provide an improved method and anti-static bag for transporting an electronic device. The anti-static bag (300 or 410) includes an insulated window for observing a temperature sensor mounted on the electronic device. The anti-static bag (300 or 410) may also include a suction valve (320) allowing for a vacuum pump (420) to remove air from the anti-static bag (300 or 410). This allows an electronic device (360) such as a computer component (240) to be transported in the anti-static bag (300 or 410), while minimizing the formation of condensation on the component when removed from the anti-static bag (300 or 410).

The anti-static bag (300 or 410) may be a part of an anti-static bag kit (400) that includes the anti-static bag (410), a vacuum pump (420), desiccants (430), and temperature sensors (440). The anti-static bag kit (400) allows a user to package an electronic device in the anti-static bag (410) with both a provided desiccant (430) and temperature sensor (440). The anti-static bag kit (400) can also provide appropriate written or downloadable instructions (not shown) for safely transporting an electronic device (360) with the included anti-static bag (410).

The kit, method, and anti-static bag, allow for repeated use of an anti-static bag, while protecting transported electronic devices from condensation and static electricity. Use of the temperature sensors allows a user to determine, prior to removing the electronic device from the bag, when the electronic device is at least warmer than the new location's dew point. This eliminates much of the formation of condensation on the electronic device due to the device being colder than the dew point.

Thus, embodiments of the invention may address the problem of transporting an electronic device from a cold environment to a warm environment, while protecting it from moisture and other harmful effects of the environment. This will potentially prolong the life of the electronic component.

The problems discussed above should be understood as being examples of problems solved by embodiments of the invention disclosed herein and the invention should not be limited to solving the same/similar problems. The disclosed invention is broadly applicable to address a range of problems beyond those discussed herein.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A bag for transporting an electronic device comprising:
an opening that includes a magnetic air tight seal;
a suction valve;
an insulating window;
a temperature sensor, wherein the temperature sensor is mounted under the insulating window; and
a plurality of layers wherein:
at least one layer of the plurality of layers comprises an anti-static material,
at least one layer of the plurality of layers comprises at least one insulating layer,
at least one layer of the plurality of layers is configured to change color over time to indicate a degree of degradation of the bag, and
a portion of an innermost layer of the plurality of layers comprises a desiccant material.

2. The bag of claim 1, wherein the magnetic air tight seal can be repeatedly opened and closed to insert or remove the electronic device to be transported within the bag.

3. The bag of claim 2, wherein when the bag is being used, a vacuum pump is attached to the suction valve and is used to remove air from the bag after the electronic device is inserted in the bag and the air tight seal is closed.

4. The bag of claim 1, wherein a second desiccant material is placed within the bag.

5. The bag of claim 4, wherein the second desiccant material comprises a silica gel in a porous packet.

6. The bag of claim 1, wherein the bag is reusable.

7. The bag of claim 1, wherein the anti-static material comprises at least a conductive layer and a dielectric layer.

* * * * *